United States Patent
Wei

(10) Patent No.: US 8,951,950 B2
(45) Date of Patent: Feb. 10, 2015

(54) ALUMINUM POST-ETCH RESIDUE REMOVAL WITH SIMULTANEOUS SURFACE PASSIVATION

(71) Applicant: EKC Technology, Inc., Hayward, CA (US)

(72) Inventor: Chia-Yin Joyce Wei, Jhubei (TW)

(73) Assignee: EKC Technology

( * ) Notice: Subject to any disclaimer, the term of this patent is extended or adjusted under 35 U.S.C. 154(b) by 149 days.

(21) Appl. No.: 13/793,908

(22) Filed: Mar. 11, 2013

(65) Prior Publication Data

US 2013/0237469 A1    Sep. 12, 2013

Related U.S. Application Data

(60) Provisional application No. 61/609,592, filed on Mar. 12, 2012.

(51) Int. Cl.
| | |
|---|---|
| C11D 7/50 | (2006.01) |
| H01L 21/02 | (2006.01) |
| C11D 11/00 | (2006.01) |
| C11D 7/26 | (2006.01) |

(52) U.S. Cl.
CPC ...... H01L 21/02052 (2013.01); *C11D 11/0047* (2013.01); *C11D 7/265* (2013.01); *C11D 7/50* (2013.01); H01L 21/02071 (2013.01)
USPC .................. 510/175; 510/176; 134/1.3

(58) Field of Classification Search
CPC ....... C11D 11/0047; C11D 7/265; C11D 7/50
USPC .................... 510/175, 176; 134/1.3
See application file for complete search history.

(56) References Cited

U.S. PATENT DOCUMENTS

| | | | |
|---|---|---|---|
| 6,235,693 B1 * | 5/2001 | Cheng et al. ............. | 510/175 |
| 2005/0202987 A1 * | 9/2005 | Small et al. .............. | 510/175 |
| 2005/0245409 A1 * | 11/2005 | Cernat et al. ............. | 510/175 |
| 2006/0000492 A1 * | 1/2006 | Carter ...................... | 134/26 |
| 2008/0171682 A1 * | 7/2008 | Kane et al. ............... | 510/176 |
| 2009/0192065 A1 * | 7/2009 | Korzenski et al. ........ | 510/176 |
| 2009/0229638 A1 * | 9/2009 | Yun et al. ................. | 134/26 |
| 2011/0306534 A1 * | 12/2011 | Hsu et al. ................. | 510/176 |

* cited by examiner

*Primary Examiner* — Gregory Webb

(57) ABSTRACT

Al post-etch residue removal composition doped with an alkanoic acid of the formula R—COOH, where R can be a linear or branched alkyl group in the form of $C_nH_{2n+1}$, where n is from 4 to 19, simultaneously passivates exposed Al surfaces while removing post-etch residues.

7 Claims, 2 Drawing Sheets

A - Concentration range for monolayer forming on Al surface
B - Beginning to see precipitation on Al surface A - Concentration range for monolayer forming on Al surface
B - Beginning to see precipitation on Al surface

ALUMINUM POST-ETCH RESIDUE REMOVAL WITH SIMULTANEOUS SURFACE PASSIVATION

BACKGROUND OF THE INVENTION

The presently disclosed and claimed inventive concept(s) relate to a composition and method designed for Front End Of Line (FEOL) semiconductor processing of substrates comprising aluminum (Al), and, more particularly, to post-etch residue removal with compositions which not only remove undesirable post etch-residues, but also simultaneously passivate exposed Al surfaces.

In fabricating integrated circuits, liquid chemical compositions have been designed for use in wafer cleaning to remove undesirable particles and processing residues from the wafer, i.e., substrate, surface and thereby prepare the wafer surface for subsequent processing steps. During wet cleaning, the particles and residues must be removed without altering the properties of the underlying substrate surface. In FEOL cleaning processes, the substrate materials are typically silicon, silicon oxides and silicon nitrides, which are robust enough to withstand relatively harsh thermal and chemical operations, and, thus, conventional wet cleaning methods have tended to employ various mixtures of inorganic acids or ammonia with hydrogen peroxide. Recent semiconductor designs have been replacing poly-silicon gates with metals coupled with implementation of high-k dielectrics. The new FEOL substrates are not able to withstand convention aggressive cleaning. Beyond that, the tolerance for substrate material loss has been getting smaller as device size has been shrinking.

Thus, the need exits for improved compositions and methods for post-etch residue removal that are compatible with new materials being used in FEOL processing, including Al, TiN, TaN, NiSi and silicon oxide. It is particularly important for such improved compositions to be designed with functionalities that will simultaneously condition, e.g., passivate, the Al metal surface and thereby protect it from degrading between device processing steps.

SUMMARY OF THE INVENTION

The presently described and claimed inventive concept(s) relate to an improved semiconductor cleaning composition for FEOL processing. In one embodiment the composition comprises:
(a) from about 50 wt % to about 90 wt % of one or more water miscible organic solvents selected from the group consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide.
(b) from 0.1 wt % to 1.0 wt % of one or more fluoride compounds selected from the group consisting of ammonium fluoride, ammonium bifluoride, and tetra alkyl ammonium fluoride;
(c) from 1 wt % to about 5 wt % of one or more chelating agents selected from organic acids, phosphonic acids, amino acids, iminiodiacetic acid, sulfonic acids and amines; and
(d) from 50 ppm to 20000 ppm of an alkanoic acid of the formula R—COOH, where R can be a linear or branched alkyl group in the form of $C_nH_{2n+1}$, where n is from 4 to 19. It has unexpectedly been discovered that the addition of a relatively long chain alkanoic acid to the composition acts as an ideal surface conditioner for Al. The alkanoic acid has been observed to form an ordered thin monolayer on the cleaned, i.e., pristine, metal surface simultaneously as the residue and other undesirable particles are being removed by action of the other components in the cleaning composition. In addition, the semiconductor cleaning composition is compatible with Al, TiN, TaN, NiSi, and silicon oxide.

In another embodiment, the described and claimed inventive concept(s) is a method for removing post-etch residues from a semiconductor substrate surface in FEOL processes wherein the semiconductor substrate surface includes Al. The method comprises applying to the surface on which the post-etch residues reside an effective amount of a composition comprising:
(a) from about 50 wt % to about 90 wt % of one or more water miscible organic solvents selected from the group consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
(b) from 0.1 wt % to 1.0 wt % of one or more fluoride compounds selected from the group consisting of ammonium fluoride, ammonium bifluoride, and tetra alkyl ammonium fluoride;
(c) from 1 wt % to about 5 wt % of one or more chelating agents selected from organic acids, phosphonic acids, amino acids, iminiodiacetic acid, sulfonic acids and amines; and
(d) from 50 ppm to 20000 ppm of an n-alkanoic acid of the formula R—COOH, where R can be a linear or branched alkyl group in the form of $C_nH_{2n+1}$, where n is from 4 to 19. Post-etch residues are removed, and the Al surface is simultaneously passivated. The ordered thin monolayer formed by the long chain n-alkanoic acid remains on the surface of the metal to protect it from corrosion and oxidation. The protective monolayer can be readily detached with plasma treatment or baking to yield a fresh clean metal surface for the next processing step.

In another embodiment the described and claimed inventive concept(s) represent an improvement in semiconductor cleaning compositions for FEOL processing. The improvement is directed to compositions for post-etch residue removal from semiconductor surfaces which include Al. The cleaning compositions typically comprise:
(a) from about 50 wt % to about 90 wt % of one or more water miscible organic solvents selected from the group consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
(b) from 0.1 wt % to 1.0 wt % of one or more fluoride compounds selected from the group consisting of ammonium fluoride, ammonium bifluoride, and tetra alkyl ammonium fluoride; and
(c) from 1 wt % to about 5 wt % of one or more chelating agents selected from organic acids, phosphonic acids, amino acids, iminiodiacetic acid, sulfonic acids and amines.

The improvement comprises doping the composition with from 50 ppm to 20000 ppm of an alkanoic acid of the formula R—COOH, where R can be a linear or branched alkyl group in the form of $C_nH_{2n+1}$, where n is from 4 to 19, wherein the alkanoic acid acts to form an ordered thin monolayer which remains on the surface of the metal to protect it from corrosion and oxidation. The protective monolayer can be readily detached with plasma treatment or baking to yield a fresh clean metal surface for the next processing step.

In yet another embodiment the described and claimed inventive concept(s) relate to a method for passivating Al in FEOL semiconductor processes while simultaneously removing post-etch residues from the semiconductor substrate being processed. The method comprises exposing the Al to from 50 ppm to 20000 ppm of an alkanoic acid of the formula R—COOH, where R can be a linear or branched alkyl group in the form of $C_nH_{2n+1}$, where n is from 4 to 19. Post-etch residues are removed and the Al is simultaneously passivated by formation of an ordered thin monolayer which remains on the surface of the metal to protect it from corrosion and oxidation.

In another embodiment the described and claimed inventive concept(s) relate to a method for inhibiting corrosion of Al while simultaneously treating a semiconductor substrate with a processing composition to remove post-etch residue. The method comprises incorporating into the processing composition from 50 ppm to 20000 ppm of an alkanoic acid of the R—COOH, where R can be a linear or branched alkyl group in the form of $C_nH_{2n+1}$, where n is from 4 to 19. Typical processing compositions for post-etch residue removal and for which the invention is most suited comprise:

(a) from 60 wt % to about 90 wt % of one or more water miscible organic solvents selected from the groups consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
(b) from 0.1 wt % to 1.0 wt % of one or more fluoride compounds selected from the group consisting of ammonium fluoride, ammonium bifluoride, and tetra alkyl ammonium fluoride; and
(c) from 1 wt % to about 5 wt % of one or more chelating agents selected from organic acids and amines.

The presently described and claimed inventive design for an improved semiconductor processing composition for post-etch residue removal demonstrates good residue removal capability while simultaneously providing a self-assembled monolayer which protects the cleaned metal surface for a prolonged period of time until the next wafer processing step. The processing composition can be used for FEOL cleaning as well as Back End Of Line (BEOL) cleaning.

Other aspects, features and advantages of the inventive concept(s) will be more fully apparent from the following detailed description and appended claims.

DETAILED DESCRIPTION OF THE INVENTION

Figure 1:
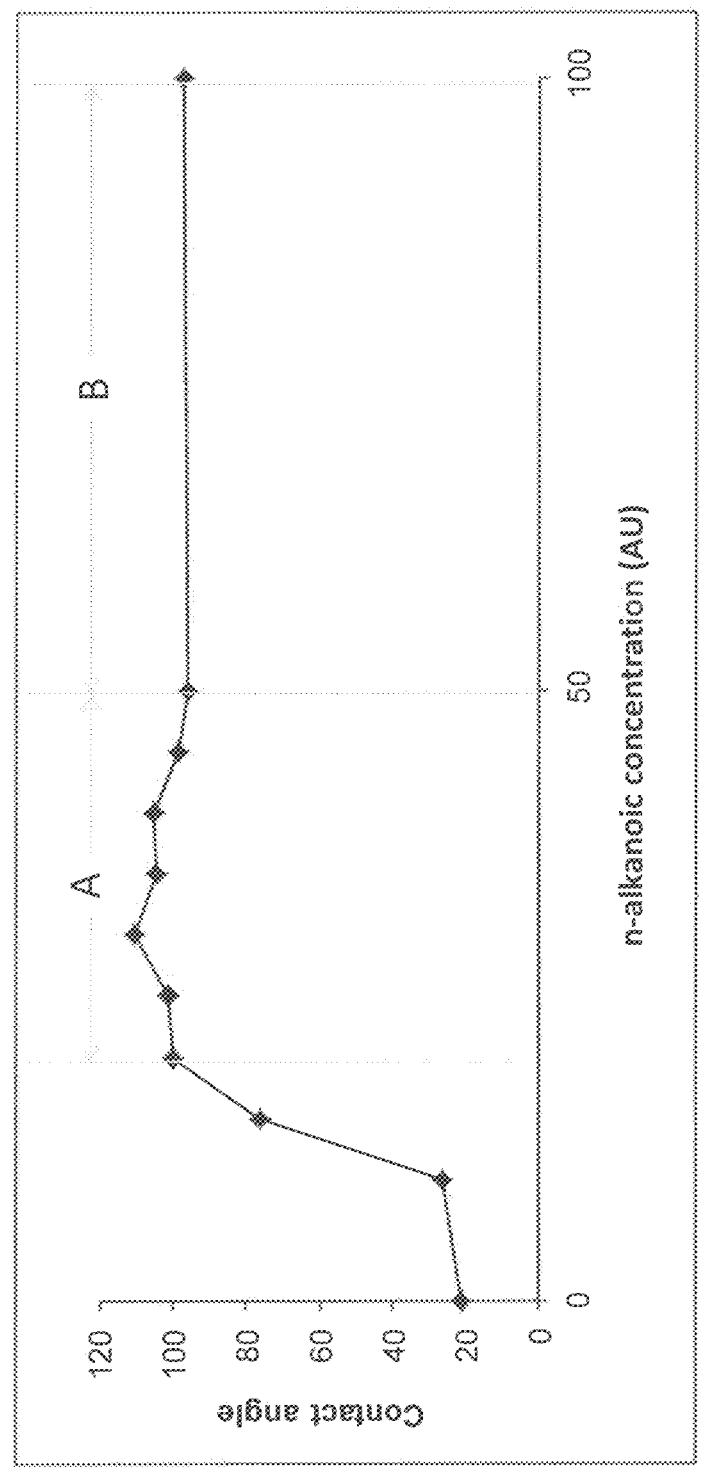
FIG. 1 is a graph which shows generally contact angle as a function of n-alkanoic acid concentration and depicts Region A and Region B, described in more detail below.

The presently described and claimed inventive concept(s) relate to an improved semiconductor processing composition for post-etch residue removal. The composition finds particular utility in FEOL processes and is compatible with materials being used in those processes, including Al, TiN, TaN, NiSi and silicon oxide.

As used herein, "residue" corresponds to particles generated during the manufacture of a semiconductor device, e.g., wafer, including, but not limited to, plasma etching, ashing, chemical mechanical polishing, wet etching, and combinations thereof.

As used herein, "low-k dielectric material" means any material used as a dielectric material in a layered microelectronic device, wherein the material has a dielectric constant less than about 3.5.

As used herein, "post-etch residue" includes, but is not limited to, material remaining following gas-phase plasma etching processes, e.g., FEOL, BEOL dual damascene processing, or wet etching processes. Post-etch residues may be organic, organometallic, organosilicic, or inorganic in nature, such as, for example, silicon-containing material, carbon-based organic material, and etch gas residue, such as oxygen and fluorine.

As used herein, "complexing agent" includes those compounds understood by one skilled in the art to be complexing agents, chelating agents, and/or sequestering agents. Complexing agents will chemically combine with or physically hold the metal ion or metal atom to be removed using the compositions described herein.

As used herein, the term "about" is intended to mean +/−5% of the stated value.

The semiconductor processing compositions, i.e., cleaning compositions, described herein possess good metal compatibility, e.g., low etch rate on the interconnect metal and/or interconnector metal silicide material. Metals of primary interest include Al, TiN, TaN, NiSi, and silicon oxide.

The cleaning compositions described herein include at least one, or more, water miscible organic solvents which may be selected from tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide. The concentration of water miscible organic solvent can range from about 50 wt % up to about 90 wt %.

The compositions described herein include from about 0.1 wt % up to about 1.0 wt % of one or more fluoride compounds selected from the group consisting of ammonium fluoride, ammonium bifluoride, and tetra alkyl ammonium fluoride.

The compositions described herein will also include from about 1.0 wt % up to about 5 wt % of one or more complexing agents selected from organic acids, phosphonic acids, amino acids, iminodiaceic acid, sulfonic acids and amines.

The described and claimed inventive concept(s) relate to the discovery that inclusion of from about 50 ppm to about 20000 ppm of an n-alkanoic acid of the formula R—COOH, where R can be a linear or branched alkyl group in the form of $C_nH_{2n+1}$, where n is from 4 to 19, in the cleaning compositions described herein operates to simultaneously form an ordered thin monolayer on the surface of the metal which remains to protect it from corrosion and oxidation after post-etch residue removal.

The most beneficial or optimum monolayer-forming range in terms of alkanoic acid concentration is determined by the corresponding maximum contact angle formation range. For example, in one embodiment, when the alkanoic acid is lauric acid, it will exhibit an optimum contact angle when the concentration in the cleaning composition is from 50 ppm to 500 ppm, and preferably from 100 ppm to 250 ppm. An operable contact angle has also been observed at higher concentrations in the range of from 3000 ppm to 10000 ppm. Stearic acid has also been observed to exhibit two different concentration ranges that correspond to an optimum contact angle for carrying out the inventive concept(s).

Long chain n-alkanoic acids as described herein impart a new and very desirable functionality to post-etch semiconductor processing compositions. Metal corrosion can be controlled because of the tendency of the n-alkanioc acid to bind to the surface of the metal and in so doing form an ordered thin monolayer on the cleaned, i.e., pristine, metal surface. The monolayer remains on the metal surface for an extended period of time and can then be readily detached with plasma treatment or baking so that a fresh metal surface is available for the next processing step Experimental Results Long chain n-alkanioc acids as described above were doped into representative post-etch semiconductor processing compositions and diluted to different concentrations. Al thin-film wafers were immersed in the doped chemical solutions at room temperature for several minutes, rinsed with de-ionized water (DIW) and blown dry with nitrogen gas. X-ray Photoelectron Spectroscopy (XPS) was employed to check the metal surface conditions after chemical treatment. Contact angles of water on the chemically treated Al wafers were measured to verify formation of a surface passivation layer.

Wafer Surface Corrosion Mechanism

One of the mechanisms observed for Al corrosion after a dry etch and wet clean processing step results from formation of surface defects due to the presence of residual etch halide gas after aging in an ambient environment. These defects can be removed along with Al oxide by a conventional ammonium peroxide cleaning mixture (APM) or other post-etch residue remover. However, during wafer queue time, i.e., holding time, until the next wafer processing step, residual halide gas has been observed to re-deposit onto the Al metal surface, and metal-halide defects may be regenerated in the ambient environment. This wafer surface corrosion mechanism is supported by XPS analysis and contact angle measurement data shown in Table 1.

TABLE 1

| | C | O | N | F | Al | Cl | Br | Cu | Contact angle |
|---|---|---|---|---|---|---|---|---|---|
| Post-etch Before Cleaning | 17.1% | 37.2% | 0.8% | 12.3% | 30.4% | 1.9% | 0.4% | N.D. | 86.99 |
| EKC Clean with No alkanoic acid | 12.7% | 40.1% | N.D. | 1.8% | 45.1% | N.D. | N.D. | 0.2% | 29.55 |
| APM Clean | 19.4% | 42.7% | 0.6% | 0.6% | 36.4% | 0.3% | N.D. | 0.1% | 30.87 |

After the dry etch and ash process steps in this example, the Al surface may oxidize and residual etch gas molecules may diffuse into the oxide layer. XPS data in Table 1 confirm the existence of F, Cl and Br on the Al metal surface. A high contact angle value confirms a hydrophobic Al oxide surface. Immediately following an EKC Clean or an APM Clean, the relative concentrations of halides remaining on the Al surface are observed to decrease significantly. There is a corresponding increase in concentrations of other elements, such as O and Al. The lower contact angles are somewhat similar for the two chemically treated surfaces and indicate a more hydrophilic Al metal surface.

To demonstrate the inventive concept(s), lauric acid, a long-chain alkanoic acid capable of forming a self-assembled monolayer on the Al metal surface according to the inventive concept(s) described herein, was selected as the Al passivator. Contact angles for a series of dilutions were measured to determine the optimum doping concentration range for forming the monolayer. With reference to the graph shown in FIG. 1, as the concentration of lauric acid increased, the molecules begin to attach onto the Al metal surface (Region A) and an ordered monolayer is formed. The corresponding contact angle reaches a maximum value that is above 90 degrees. When more lauric acid molecules are doped into the solution, they begin to attach onto the first monolayer and form randomly oriented secondary layers. As a result, the contact angle begins to decrease. Visual detection of a lauric acid thin film on the Al metal surface (Region B) is possible at higher acid concentrations. Contact angle measurements allow selection of the optimum alkanoic acid concentration range for monolayer formation according to the invention.

Figure 2:
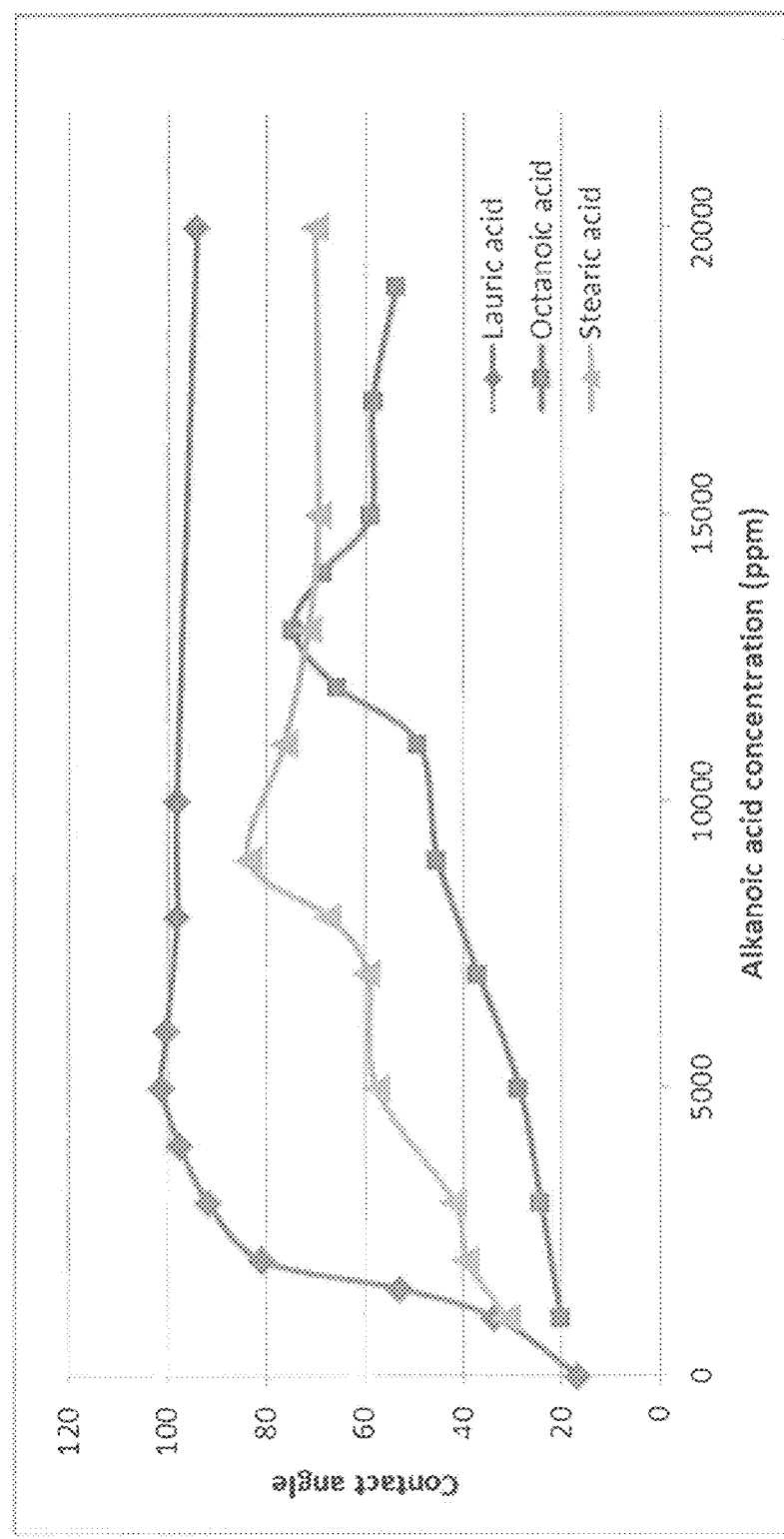
FIG. 2 is a graph which shows contact angle as a function of acid concentration for three species of alkanoic acid.

To further demonstrate the invention, additional formulations were prepared with different long-chain alkanoic acids capable of forming a self-assembled monolayer on the Al metal surface as the Al passivator. Formulation data selected for this example are shown in Table 1A. Octanoic acid, lauric acid and stearic acid were selected as the alkanoic acid components of the formulation. The acids are listed in Table 1B along with the observed contact angles and the corresponding monolayer concentration ranges. The resulting contact angles are also depicted graphically in FIG. 2.

TABLE 1A

| Description | Raw Material | Actual wt % |
|---|---|---|
| Fluoride species 1 | Ammonium fluoride | 0.08% |
| Fluoride species 2 | Tetrabutyl ammonium fluoride | 0.525% |
| Solvent | tetrahydrofuryl alcohol | 90% |
| Chelator 1 | N-(2-Hydroxyethyl)morpholine | 2.86% |
| Chelator 2 | glycolic acid | 0.42% |

TABLE 1A-continued

| Description | Raw Material | Actual wt % |
|---|---|---|
| water | Water | Balanced to 100% |
| Alkanoic acid | | 0.005% to 2% (50-20000 ppm) |

TABLE 1B

| Alkanoic Acid | n | Largest Contact Angle | Monolayer Concentration Ranges |
|---|---|---|---|
| Octanoic acid | 7 | 74.5 | 12000-15000 ppm |
| Lauric acid | 11 | 101.2 | Range 1 - 100-250 ppm |
| | | | Range 2 - 3000-10000 ppm |
| Stearic acid | 17 | 83.06 | Range 1 - 500-1000 ppm |
| | | | Range 2 - 9000-13000 pm |

The doped composition not only removes undesirable post etch residues and halide contaminants, but it also deposits a passivation monolayer on the Al metal surface. This result is confirmed by the XPS results of elemental concentrations shown in Table 2, which show a large contact angle and reduced XPS signals for F, Cl and Br. Carbon concentrations of 17.1% and 22.8% in lines 1 and 2 of Table 2 also correspond to formation of a passivation monolayer according to the inventive concept(s) described herein.

TABLE 2

|  | C | O | N | F | Al | Cl | Br | Cu | Contact angle |
|---|---|---|---|---|---|---|---|---|---|
| Post-etch before Clean | 17.1% | 37.2% | 0.8% | 12.3% | 30.4% | 1.9% | 0.4% | N.D. | 86.99 |
| Clean with alkanoic acid | 22.8% | 33.6% | N.D. | 3.0% | 40.5% | N.D. | N.D. | 0.1% | 100.84 |
| Alkanoic acid monolayer removed by Ar ion sputtering | 1.3% | 36.7% | N.D. | 3.1% | 58.8% | N.D. | N.D. | 0.2% | — |

Line 3 shows XPS signals for the Al test wafer after exposure to ten (10) seconds of Ar ion sputtering. XPS data for C reveal a drop in carbon concentration which is evidence that the alkanoic acid monolayer has been removed and that a fresh Al metal surface has been generated. This is also supported by an increase in the XPS signal for Al.

What is claimed is:

1. A semiconductor cleaning composition comprising:
   (a) from 50 wt % to about 90 wt % of one or more water miscible organic solvents selected from the groups consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
   (b) from 0.1 wt % to 1.0 wt % of one or more fluoride compounds selected from the group consisting of ammonium fluoride, ammonium bifluoride, and tetra alkyl ammonium fluoride;
   (c) from 1 wt % to about 5 wt % of one or more chelating agents selected from organic acids, phosphonic acids, iminodiacetic acid, sulfonic acids and amines; and
   (d) from 50 ppm to 20000 ppm of an alkanoic acid of the formula R—COOH, where R can be a linear or branched alkyl group in the form of $C_nH_{2n+1}$, where n is from 4 to 19.

2. The semiconductor cleaning composition of claim 1 which is compatible with Al, TiN, TaN, NiSi, and silicon oxide.

3. A method for removing post-etch residues from a semiconductor substrate surface in FEOL processes wherein the semiconductor substrate surface includes Al, said method comprising applying to the surface on which said post-etch residues reside an effective amount of a composition comprising:
   (a) from 50 wt % to about 90 wt % of one or more water miscible organic solvents selected from the groups consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
   (b) from 0.1 wt % to 1.0 wt % of one or more fluoride compounds selected from the group consisting of ammonium fluoride, ammonium bifluoride, and tetra alkyl ammonium fluoride;
   (c) from 1 wt % to about 5 wt % of one or more chelating agents selected from organic acids, phosphonic acids, iminodiacetic acid, sulfonic acids and amines; and
   (d) from 50 ppm to 20000 ppm of an alkanoic acid of the formula R—COOH, where R can be a linear or branched alkyl group in the form of $C_nH_{2n+1}$, where n is from 4 to 19 whereby post-etch residues are removed and the Al surface is simultaneously passivated.

4. In a semiconductor cleaning composition for FEOL processing wherein post-etch residues are removed from semiconductor surfaces which include Al and said cleaning composition comprises:
   (a) from 50 wt % to about 90 wt % of one or more water miscible organic solvents selected from the groups consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
   (b) from 0.1 wt % to 1.0 wt % of one or more fluoride compounds selected from the group consisting of ammonium fluoride, ammonium bifluoride, and tetra alkyl ammonium fluoride;
   (c) from 1 wt % to about 5 wt % of one or more chelating agents selected from organic acids, phosphonic acids, iminodiacetic acid, sulfonic acids and amines;
   the improvement comprising doping the composition with from 50 ppm to 20000 ppm of an alkanoic acid of the formula R—COOH, where R can be a linear or branched alkyl group in the form of $C_nH_{2n+1}$, where n is from 4 to 19.

5. A method for passivating Al in FEOL semiconductor processes while simultaneously removing post-etch residues from the semiconductor substrate being processed, said method comprising exposing the Al to from 50 ppm to 20000 ppm of an alkanoic acid of the formula R—COOH, where R can be a linear or branched alkyl group in the form of $C_nH_{2n+1}$, where n is from 4 to 19, whereby post-etch residues are removed and the Al is simultaneously passivated.

6. A method for inhibiting corrosion of Al while simultaneously treating a semiconductor substrate with a processing composition to remove post-etch residue wherein the method comprises incorporating into the processing composition from 50 ppm to 20000 ppm of an alkanoic acid of the formula R—COOH, where R can be a linear or branched alkyl group in the form of $C_nH_{2n+1}$, where n is from 4 to 19.

7. The method of claim 6 wherein the processing composition comprises:
   (a) from 50 wt % to about 90 wt % of one or more water miscible organic solvents selected from the groups consisting of tetrahydrofurfuryl alcohol, glycol ethers, diglycol ethers, dipropylene glycol, alkyl diols, aliphatic alcohols, glycerine, N-methyl-2-pyrrolidinone, sulfolane and dimethyl sulfoxide;
   (b) from 0.1 wt % to 1.0 wt % of one or more fluoride compounds selected from the group consisting of ammonium fluoride, ammonium bifluoride, and tetra alkyl ammonium fluoride; and (c) from 1 wt % to about 5 wt % of one or more chelating agents selected from organic acids, phosphonic acids, iminodiacetic acid, sulfonic acids and amines.

\* \* \* \* \*